US012668870B2

(12) United States Patent
    Srinivasan et al.

(10) Patent No.: US 12,668,870 B2
(45) Date of Patent: Jun. 30, 2026

(54) ION BEAM DEPOSITION OF A LOW RESISTIVITY METAL

(71) Applicant: VEECO INSTRUMENTS INC., Plainview, NY (US)

(72) Inventors: Narasimhan Srinivasan, Plainview, NY (US); Tania Henry, Plainview, NY (US); Frank Cerio, Plainview, NY (US); Paul Turner, Plainview, NY (US); Vincent Ip, Plainview, NY (US); Rutvik Mehta, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 280 days.

(21) Appl. No.: 18/522,193

(22) Filed: Nov. 28, 2023

(65) Prior Publication Data
    US 2024/0093356 A1     Mar. 21, 2024

Related U.S. Application Data

(62) Division of application No. 17/197,885, filed on Mar. 10, 2021, now abandoned.

(60) Provisional application No. 62/991,537, filed on Mar. 18, 2020.

(51) Int. Cl.
    *C23C 14/16*      (2006.01)
    *C23C 14/34*      (2006.01)
    *H01J 37/34*      (2006.01)

(52) U.S. Cl.
    CPC .......... *C23C 14/3442* (2013.01); *C23C 14/16* (2013.01); *H01J 37/3426* (2013.01)

(58) Field of Classification Search
    None
    See application file for complete search history.

(56) References Cited

U.S. PATENT DOCUMENTS

| | | | |
|---|---|---|---|
| 4,920,094 A | 4/1990 | Nogawa et al. |
| 5,628,659 A | 5/1997 | Xie et al. |
| 5,650,378 A | 7/1997 | Iijima et al. |
| | (Continued) | |

FOREIGN PATENT DOCUMENTS

| | | |
|---|---|---|
| CN | 101880862 A | 11/2010 |
| CN | 110541153 A | 12/2019 |
| | (Continued) | |

OTHER PUBLICATIONS

International Search Report from corresponding PCT application No. PCT/US2021/021744, dated Jun. 25, 2021.

(Continued)

*Primary Examiner* — Daniel J. Schleis
(74) *Attorney, Agent, or Firm* — HOLZER PATEL DRENNAN

(57)          ABSTRACT

Methods for forming thin, low resistivity metal layers, such as tungsten (W) and ruthenium (Ru) layers. The methods include depositing a metal material onto a substrate via ion beam deposition with assist in a process chamber at a temperature of at least 250° C. to produce the metal film. A resulting thin tungsten film has large and highly oriented $\alpha(110)$ grains having a resistivity less than 10 $\mu\Omega$-cm and thickness less than 300 Å, with no discernable $\beta$-phase. A resulting thin ruthenium film has a resistivity less than 12 $\mu\Omega$-cm and a thickness less than 300 Å.

12 Claims, 8 Drawing Sheets

(56) References Cited

U.S. PATENT DOCUMENTS

| | | | |
|---|---|---|---|
| 6,229,250 | B1 | 5/2001 | Nakanishi et al. |
| 6,500,676 | B1 | 12/2002 | Ramberg |
| 6,503,578 | B1 | 1/2003 | Yeh et al. |
| 6,783,637 | B2 | 8/2004 | Slaughter et al. |
| 7,068,430 | B1 | 6/2006 | Clarke et al. |
| 8,309,937 | B2 | 11/2012 | Kameyama |
| 8,409,985 | B2 | 4/2013 | Chan et al. |
| 8,409,987 | B2 | 4/2013 | Chandrashekar et al. |
| 8,623,733 | B2 | 1/2014 | Chen et al. |
| 9,347,127 | B2 | 5/2016 | Druz et al. |
| 9,589,808 | B2 | 3/2017 | Bamnolker et al. |
| 10,043,670 | B2 | 8/2018 | Ramalingam et al. |
| 2005/0053845 | A1 | 3/2005 | Becker et al. |
| 2007/0076833 | A1* | 4/2007 | Becker ...................... G03F 1/30 430/4 |
| 2008/0257715 | A1 | 10/2008 | Hoghoj et al. |
| 2014/0014497 | A1* | 1/2014 | Druz ....................... C23C 14/10 204/192.11 |
| 2017/0117153 | A1 | 4/2017 | Ramalingam et al. |
| 2022/0081756 | A1 | 3/2022 | Hou et al. |

FOREIGN PATENT DOCUMENTS

| | | | | |
|---|---|---|---|---|
| EP | 2625305 | B1 | 5/2019 | |
| JP | S5910225 | A | 1/1984 | |
| JP | 2017057487 | A | 3/2017 | |
| KR | 1020120082863 | A | 7/2012 | |
| TW | 200513812 | A | 4/2005 | |
| TW | 201728767 | A * | 8/2017 | .......... H01J 37/3435 |
| WO | 2006040613 | A1 | 4/2006 | |

OTHER PUBLICATIONS

"Ion Beam Etching Technology for Sensor Manufacturing", from Scia Systems GmbH, Chemnitz, Germany, presented at SEMICON Europe in Munich, Germany on Nov. 16, 2017.

"SCIA COAT 200 High Quality Multilayer Deposition", from Scia Systems GmbH, Chemnitz, Germany (Jan. 2019).

Abe, Yoshio , et al., "C-Axis-Oriented Ru Thin Films Prepared by Sputtering in Ar and O2 Gas Mixture", Japan Journal of Applied Physics, vol. 40, Dec. 2001, 6956-6958.

Abe, Yoshio , et al., "Highly Textured (100) RuO2/(001) Ru Multilayers Prepared by Sputtering", Japan Journal of Applied Physics, vol. 41, Nov. 2002, 6857-6861.

Belser, Richard B., et al., "Temperature Coefficients of Resistance of Metallic Films in the Temperature Range 25° to 600°C", Journal of Applied Physics, vol. 30, No. 3, Mar. 1959, 313-322.

Choi, Dooho , et al., "Electron mean free path of tungsten and the electrical resistivity of epitaxial (110) tungsten films", Phys. Rev. B 86, Jul. 23, 2012, 045432, Jul. 23, 2012.

Choi, Dooho , et al., "On the Potential of Tungsten as Next-generation Semiconductor Interconnects", Electron. Material Letters, vol. 13, No. 5, (2017), 449-456.

Choi, Dooho, et al., "Phase grain structure, stress, and resistivity of sputter-deposited tungsten films", Journal of Vacuum Science & Technology, (2011) A 29, 051512.

Deng, Ruopeng , et al., "Biaxial texture development in aluminum nitride layers during off-axis sputter deposition", Journal of Vacuum Science & Technology, (2012) A 30, 051501.

Gerstenberg, D. , et al., "Effects of Nitrogen, Methane, and Oxygen on Structure and Electrical Properties of Thin Tantalum Films", Journal of Applied Physics, vol. 35, No. 2, Feb. 1964, 402-407.

Kao, A. S., et al., "Microstructure and properties of dual ion beam sputtered tungsten film", Journal of Vacuum Science & Technology A 7, (1989), 2966-2974.

Lee, Jeong-Seop , et al., "Growth and characterization of Alpha and Beta-phase tungsten films on various substrates", Journal of Vacuum Science & Technology, (2016) A 34, 021502.

Lee, Soo Jung , et al., "Properties of tungsten thin film deposited using inductively coupled plasma assisted sputtering for next-generation interconnect metal", Thin Solid Films, Jan. 30, 2019, vol. 674, pp. 64-70, Jan. 30, 2019, 64-79.

Liu, M. X., et al., "Template-induced formation of α-W and size-dependent properties of tungsten thin films", Materials Science and Engineering B 139, Apr. 25, 2007, 99-104.

Shen, Y. G., et al., "Residual stress, microstructure, and structure of tungsten thin films deposited by magnetron sputtering", Journal of Applied Physics, 87, No. 1, Jan. 1, 2000.

Zheng, Pengyuan , et al., "Epitaxial grown of tungsten layers on MgO(001)", Journal of Vacuum Science & Technology, (2015) A 33, 061505.

Zheng, Pengyuan , et al., "The anisotropic size effect of the electrical resistivity of metal thin films: Tungsten", Journal of Applied Physics, (2017) 122, 135301.

Zhu, Fei , "Phase control and Young's modulus of tungsten thin film prepared by dual ion beam sputtering deposition", AIP Advnces 8, 035321, Mar. 27, 2018.

European Search Report from corresponding EP application No. 21772643.9 corresponding to PCT/US2021/021744, dated Feb. 27, 2024.

Choi, Dooho , et al., "Phase, grain structure, stress, and resistivity of sputter-deposited tungsten films", Journal of Vacuum Science, American Institute of Physics, 2 Huntington Quadrangle, Melville, NY 11747, vol. 29, No. 5, Aug. 15, 2011, 51512-51512.

Hofer, A. M., et al., "Sputtered molybdenum films: Structure and property evolution with film thickness", Vacuum, vol. 99, Jan. 1, 2014, 149-152.

Kao, A. S., et al., "Microstructure and properties of dual ion beam sputtered tungsten film", Journal of Vacuum Science, American Institute of Physics, 2 Huntington Quadrangle, Melville, Ny 11747, vol. 7, No. 4, Sep. 1, 1989, 2966-2974.

Lee, Jeong-Seop , et al., "Growth and characterization of[alpha]and[beta]-phase tungsten films on various substrates", Journal of Vacuum Science, American Institute of Physics, 2 Huntington Quadrangle, Melville, NY 11747, vol. 34, No. 2, Nov. 24, 2015.

Yadav, Praveen Kumar, et al., "Influence of ion-to-atom ratio on the microstructure of evaporated molybdenum thin films grown using low energy argon ions", Journal of Vacuum Science, American Institute of Physics, 2 Huntington Quadrangle, Melville, NY 11747, vol. 32, No. 2, Jan. 22, 2024.

* cited by examiner

200

300

400

500

ION BEAM DEPOSITION OF A LOW RESISTIVITY METAL

CROSS-REFERENCE

This application is a divisional application of U.S. non-provisional application Ser. No. 17/197,885 filed Mar. 10, 2021, which claims priority to U.S. provisional application Ser. No. 62/991,537 filed Mar. 18, 2020 and entitled ION BEAM DEPOSITION OF LOW RESISTIVITY TUNGSTEN, both of which are incorporated herein by reference for all purposes.

BACKGROUND

Ion beam deposition (IBD) is one of many methods suitable for forming metallic films, the other methods including (but not limited to) plasma vapor deposition (PVD), chemical vapor deposition (CVD), and molecular beam epitaxy (MBE). MBE is useful for depositing layers at very low energy, which can produce pseudo epitaxial layers. PVD is useful for depositing layers at a higher energy, which can produce layers that have, e.g., good electrical conductivity capabilities. IBD is useful for depositing layers at still higher energy and reduced pressures and with control of deposition geometry, which can produce layers with higher crystallinity and with controlled microstructures.

With all these methods, various thickness of films can be produced. Below certain thicknesses, as the metal film thickness decreases, the resistivity of the metal increases.

What is desired is a thin, low resistivity metal film.

SUMMARY

The present disclosure is directed to methods of forming thin layers of a metal, for example, tungsten (W) and ruthenium (Ru), having low resistivity, by ion beam deposition. The methods include using an assist ion beam and/or elevated processing temperatures; a particular method includes utilizing a heated substrate during ion beam deposition with assist ion beam.

The methods described herein can be used to form films of predominantly α-phase tungsten, having a highly oriented grain texture with preferred orientation of grains with the low resistivity α(110) planes. The films may also show a reduced α(200) tungsten peak and an increased α(110) and α(211) peaks. This α(200) component reduction and α(110) and α(211) increase, which corresponds to a microstructure with a distinct texture combined with larger grain size, results in low tungsten resistivity.

This disclosure describes a method of forming a thin metal film, the method comprising depositing a metal material from a target onto a substrate via ion beam deposition in a process chamber, the substrate at a temperature of at least 300° C., or at least 325° C., or at least 350° C., and simultaneously bombarding at least some of the deposited material from the substrate in the process chamber to obtain a net deposition rate greater than 0.5 angstroms/second. In some instances, the bombarding is done using an assist ion beam to modify or etch at least some of the deposited material. This bombarding may be done using an assist ion beam at at least 350° C.

This disclosure also describes an ion beam deposition system having an ion beam deposition source, a target having an angle from about 20 to about 40 degrees relative to an ion beam from the ion beam deposition source, an assist ion beam source, a substrate assembly for retaining a substrate, and a heater configured to heat the substrate to a temperature of at least 300° C. The substrate assembly is positioned to receive a sputter plume from the target and to receive an ion beam from the assist ion beam source, and the substrate assembly is pivotable in relation to the target and to the assist ion beam source.

The methods described herein can be used to form a metal film having a thickness of about 100 to about 300 Angstrom and a resistivity of about 8 to about 12 μΩ-cm, in some implementations about 8 to about 11 μΩ-cm. The methods also can control the microstructure of the film.

For example, the methods described herein can be used to form a tungsten film having a thickness of about 100 to about 300 Angstrom and a resistivity of about 8 to about 11 μΩ-cm. A tungsten film made by these methods may have a highly oriented microstructure with a dominant α(110) texture, defined as a majority of grains (e.g., greater than 60%, 70%, 80%, and up to >90% of grains) oriented with low resistivity α(110) planes along film growth direction. A tungsten film made by these methods may have little or no β-phase tungsten. A tungsten film made by these methods may have a low resistivity α(110) fiber texture. A tungsten film may have a crystal orientation of α(110) as signified with X-ray diffraction peak ratios larger than 1 for α(110) to α(200) and also larger than 1 for α(110) to α(211).

A tungsten film made by these methods may have a highly controlled microstructure with grain size and growth habit tunable by the method used, resulting in microstructures with grains growing along specific planes and directions. The film may be a highly textured film. Further, a tungsten film made by these methods may have large grain size of greater than 100 nm equivalent circular diameter, and in some instances grain sizes larger than 150 nm and even larger than 200 nm equivalent circular diameter.

The methods herein, of using ion beam deposition with assist ion beam for lowering resistivity via controlling microstructure, grain size and grain orientation, could be applicable to other metallic elements in the periodic table for example from Groups 6 to 11, such as but not limited to Mo, Ru, Co, Cu, Rh, and the like. As an example, this disclosure also provides a ruthenium (Ru) film having a thickness of about 100 to about 300 Angstrom and a resistivity of about 8 to about 12 μΩ-cm.

Still further, this disclosure describes methods for controlling the microstructure, texture and grain orientation of metal films with use of, in combination or individually, remote ion assist etch source, heat and off normal angle deposition and etching. The disclosure also describes methods for controlling the microstructure, grain sizes and grain size distribution of a tungsten film. For example, methods are described that control the α(110) tungsten peak, α(200) tungsten peak and α(211) tungsten peak ratios.

In one particular implementation, this disclosure provides a method of forming a thin metal film, the method comprising depositing a metal material from a target onto a substrate via ion beam deposition in a process chamber, the substrate at a temperature of at least 250° C., and simultaneously bombarding at least some of the deposited material from the substrate in the process chamber, such as with an assist ion beam, at a net deposition rate of at least 0.5 angstroms/second to produce the metal film. To form a tungsten film, the target includes an amount of tungsten; similarly, to form a ruthenium firm, the target includes an amount of ruthenium.

In another particular implementation, this disclosure provides a method of forming a thin metal film, the method comprising depositing a metal material from a target onto a substrate via ion beam deposition at an angle off-normal to the substrate in a process chamber, the substrate at a temperature of at least 250° C., and simultaneously bombarding at least some of the deposited material from the substrate in the process chamber to produce the metal film. To form a tungsten film, the target includes an amount of tungsten; similarly, to form a ruthenium firm, the target includes an amount of ruthenium.

For either of these methods, and any others, a deposition angle, for depositing the metal material, can be about 40-45 degrees from normal to the substrate, and an assist beam angle, for etching the deposited material, can be about 20-25 degrees from normal to the substrate. Either or both the deposition angle and the assist beam angle (the etch angle) can be adjusted during the method. The metal material can be deposited from a target onto a substrate via ion beam deposition that utilizes an ion beam having a voltage less than 1000V, or greater than 1500V. The metal material can be deposited at an angle normal or off-normal to the substrate. The ion beam etching can utilize an assist ion beam having a voltage of at least 100V or no more than 1000V. The ion beam etching of at least some of the deposited material can be at an angle normal or off-normal to the substrate.

In another particular implementation, this disclosure provides an ion beam deposition system comprising a primary ion beam deposition source, a metal target positioned to receive an ion beam from the primary ion beam source, an assist ion beam source, a pivotable substrate assembly for retaining a substrate, the assembly positioned to receive a sputter plume from the metal target and to receive an ion beam from the assist ion beam source, the substrate assembly pivotable in relation to the metal target and to the assist ion beam source, and at least one radiative heater configured to heat the substrate to a temperature of at least 250° C., in some implementations at least 300 and even at least 350° C. The substrate assembly is pivotable from normal to off-normal in relation to the metal target and pivotable from normal to off-normal in relation to the assist ion beam source.

In yet another particular implementation, this disclosure provides a thin metal tungsten film having a crystalline structure comprising $\alpha(110)$, $\alpha(200)$ and $\alpha(211)$, and no discernable $\beta$-phase. Similar crystalline structures can be obtained for other metal films, such as for Ru, Mo, Co, Cu, Rh, and the like.

This Summary is provided to introduce a selection of concepts in a simplified form that are further described below in the Detailed Description. This Summary is not intended to identify key or essential features of the claimed subject matter, nor is it intended to be used to limit the scope of the claimed subject matter. These and various other features and advantages will be apparent from a reading of the following Detailed Description.

DETAILED DESCRIPTION

Figure 1:
FIG. 1 is a schematic side view of an ion beam deposition tool with an assist ion beam.
Figure 1:
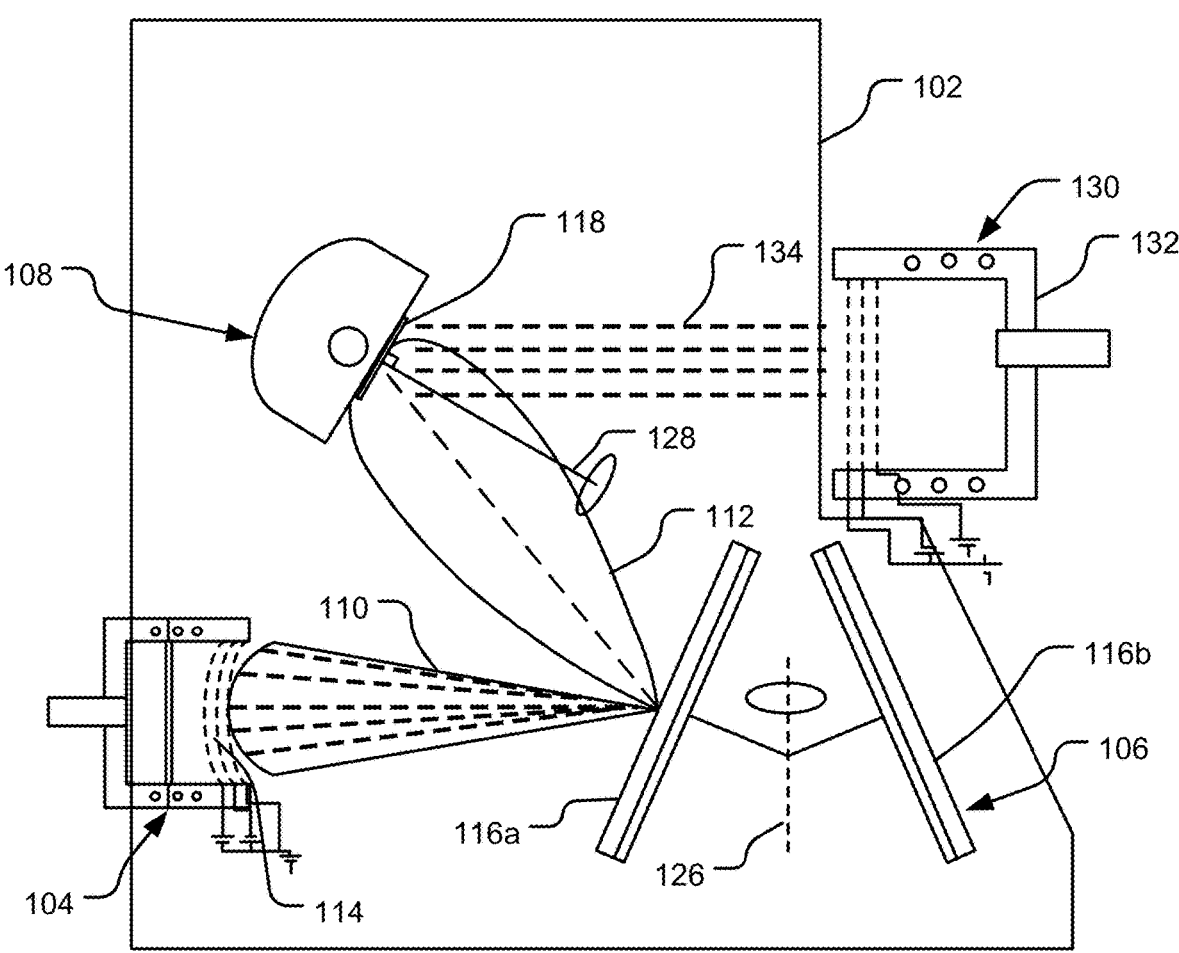

This disclosure is directed to deposition of thin film, low resistivity metal (e.g., tungsten, ruthenium) by ion beam deposition. Addition of an assist ion beam and/or heating of the process further lowers the resistivity. Sputter deposition and ion beam deposition (IBD) are known methods for depositing thin film materials on substrates. The substrate may be tilted to different angles to optimize the properties of the deposited film and rotated to average out non-uniformities introduced by the tilting.

As electronic devices shrink in size, the dimensions of conductive metal lines use to form circuits and the link also shrink, both in width and length and also in thickness. Resistivity of metallic films is strongly dependent on the thickness of the films as they approach dimensions of the order of electron mean free path (EMFP), e.g., a range of 9 to 300 nm. At these dimensions, the resistivity increases with reduced thickness. This reduction in metal line dimensions combined with increased resistivity has negative consequences for the RC delay (resistive-capacitive delay), which hinders the speed in microelectronic integrated circuits.

Tungsten is currently used as a material for bit line wiring for dynamic random access memory (DRAM) and other semiconductor structures, and is susceptible to this resistivity size effect. Thus, there is a desire to be able to deposit tungsten films, and other metal films, of low resistivity even as the film thickness is reducing.

Tungsten is uniquely challenging because of the difficulty in depositing thin films in predominantly $\alpha$-phase, which is the low resistivity phase, as opposed to the $\beta$-phase of tungsten, which forms readily at very low thicknesses but has a higher resistivity. By controlling the early growth and the subsequent growth mechanism of the tungsten, growth of the $\beta$-phase can be inhibited, resulting in increased proportion of the $\alpha$-phase. In some implementations, essentially no discernible $\beta$-phase is present, defined by the lack of beta phase peaks in X-ray diffraction.

Additionally, tungsten, ruthenium and other metals such as Mo, Co, Cu, Rh and others, demonstrate a size-dependent anisotropic electrical resistivity where the normally isotropic resistivity shows a dependence on the grain texture, orientation and epitaxy as film thickness and grain size decreases below 100 nm, with strong anisotropic dependence below 50 nm. Metal films, e.g., tungsten, with α(200), α(110) and α(211) crystal orientations each have different resistivity for the same grain size and thickness and, as a result, it is necessary to control the film texture and grain orientation in order to achieve low resistivity films.

With the methods described herein, the crystalline orientation is controllable, especially, the relative amount of α(110) compared to α(211) and to α(200) is increased, thus affecting the resistivity and also providing an increased texture of the metal film and formation of a fiber texture. As a result, grains with random orientation are reduced and grains with α(110) are increased.

As a result with the methods described herein, the amount and fraction of α(110) grains in thin metals films is higher, with α(110) grains fraction greater than 60% in some implementations, in some implementations greater than 70%, and in some implementations greater than 80%, and in yet some implementations greater than 90%; this is particularly applicable to tungsten.

The ratio of the amount of α(200) to α(211), as represented by the peaks in glancing angle theta-2theta X-ray diffraction, is at least 1:5 in some implementations, in some implementations at least 1:7, in some implementations at least 1:10, in yet some implementations at least 1:12, and even at least 1:15, with greater amounts of α(211) desired. That is, in some implementations, the amount of α(211) is at least 15 times more than the amount of α(200).

In some implementations, the ratio of the amount of α(110) to α(211) in the thin metal film, as represented by the peaks in glancing angle theta-2theta X-ray diffraction, in some implementations is at least 1:0.2 (or, 5:1), in some implementations at least 1:0.25 (or, 4:1), in some implementations at least 1:0.3 (or, about 3:1), in yet some implementations at least 1:0.4 (or, about 2.5:1), and even at least 1:0.5 (or, 2:1), with greater amounts of α(211) desired.

The methods described herein provide thin, low resistivity metal films.

For example, the methods provide thin tungsten films having, e.g., a resistivity no more than 11 μΩ-cm, in some implementations no more than 10.5 μΩ-cm, in some implementations no more than 10.2 μΩ-cm, and even no more than 10 μΩ-cm (that is, 10 μΩ-cm and less). The methods described herein provide tungsten films ranging in thickness from 100 to 325 Angstroms and having a resistivity of 8 μΩ-cm to 11 μΩ-cm. In some tungsten films, the resistivity ranges from 8 μΩ-cm to 10 μΩ-cm, and in other films ranges from 8 μΩ-cm cm to 9 μΩ-cm. The methods described herein can also provide a tungsten film having a thickness ranging from 200 to 250 Angstroms having a resistivity ranging from 8 μΩ-cm to 9 μΩ-cm, as well as provide a tungsten film having a thickness ranging from 250 to 300 Angstroms with a resistivity of 8 μΩ-cm to 8.5 μΩ-cm.

The methods described herein also provide thin ruthenium films ranging in thickness from 100 to 325 Angstroms and having a resistivity of 8 μΩ-cm to 12 μΩ-cm. In some ruthenium films, the resistivity ranges from 8 μΩ-cm to 10 μΩ-cm, and even further ranging from 8 μΩ-cm to 9 μΩ-cm. The methods described herein can also provide a ruthenium film having a thickness ranging from 180 to 250 Angstroms having a resistivity ranging from 9 μΩ-cm to 11 μΩ-cm as well as providing a ruthenium film having a thickness ranging from 250 to 300 Angstroms with a resistivity of 8 μΩ-cm to 9 μΩ-cm.

In the following description, reference is made to the accompanying drawing that forms a part hereof and in which is shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below. In some instances, a reference numeral may have an associated sub-label consisting of a lower-case letter to denote one of multiple similar components. When reference is made to a reference numeral without specification of a sub-label, the reference is intended to refer to all such multiple similar components.

FIG. 1 illustrates a system 100 according to the present disclosure, the system 100 including an ion beam deposition (IBD) system and an assist ion or ion beam system. The system 100 includes various elements from a conventional IBD system, such as a chamber 102 having therein an ion source 104, a target sub-assembly 106, and a substrate assembly 108 for supporting a substrate 118.

The ion beam source 104 generates an ion beam 110, which can include a plurality of ion beamlets targeted or directed toward the target assembly 106, which includes at least one target 116, in this illustrated system, a first target 116a and a second target 116b, both of which can be tungsten (W) if tungsten is the metal to be deposited; alternately the target 116 includes a metal from Groups 6 to 11 of the periodic table of the elements, such as but not limited to Mo, Ru, Co, Cu, Rh. For example, if ruthenium (Ru) is to be deposited, the target 116 includes an amount of ruthenium.

The source gas used in ion source 104 is typically a noble gas such as helium, xenon, argon, or krypton. The system 100 may include one or more grids 114 proximate the ion beam source 104 for directing the ion beam 110 from the ion beam source 104 to the target 116.

Also present in the system 100 is a heat source, such as heating element(s) present within the chamber 102 (not shown). The heating element(s) may be, e.g., heating element(s) positioned on the chamber walls, heating element(s) positioned within the chamber, or heating element(s) as part of or connected to the substrate assembly 108. The heating element(s) may be, e.g., conductive coils, another conductive heat source, a radiative heating source (e.g., lamp), or inductive heat source. The heating element(s) may heat the substrate 118 directly or indirectly (e.g., by heating the atmosphere in the chamber 102). The heating element(s) are configured to heat the substrate 118 to a temperature of at least 200° C. In some embodiments, the heating element(s) are configured to heat the substrate 118 to a temperature of at least 250° C.; and in some additional embodiments, the heating element(s) are configured to heat the substrate 118 to a temperature of at least 300° C., or at least 325° C., or at least 350° C. If directly heating the substrate 118 by the assembly 108, such heating could also include flowing a gas, e.g., He, Ar, and the like, behind the substrate to transfer heat effectively.

The ion beam 110, upon striking one of the targets 116, generates a sputter plume 112 of material from the target 116. The ion beam 110 strikes the target 116 at such an angle so that the sputter plume 112 generated from the target 116 travels towards the substrate assembly 108. The sputter plume 112 may be made more or less concentrated so that its resulting deposition of material on a substrate 118 of the substrate assembly 108 is more effectively distributed over a particular area of the substrate 118.

The target assembly 106 is positioned so that the sputter plume 112 strikes the target 116 at a desired angle as well. In one example implementation, the target assembly 106 is attached to a fixture (not called out) that allows the target 116 to be rotated or moved in a desired manner, including rotation of the entire target assembly 106 about an axis 126 or pivoting of the target 116 or target assembly 106 to change the angle of the target 106 in relation to the axis 126. Additionally or alternately, the substrate assembly 108 can be pivotable in relation to target 116 and to the assist ion beam 134, e.g., from normal to off-normal.

The system 100, particularly the IBD portion of the system 100, can utilize a high energy ion beam having a voltage ranging from 500V to 2000V, or, ranging from 1000V to 2000V. In some implementations, the ion beam has a voltage less than 1000V, whereas in other implementations the ion beam has a voltage greater than 1500V.

The system 100 also includes an assist ion beam system 130 that provides a source of ions that bombards substrate 118 so that material on substrate 118 is removed or modified. The assist ion beam system 130 may be referred to an ion beam etching system, or the like. The assist ion beam system 130 includes an ion beam source 132 that generates an assist ion beam 134, that can include a plurality of ion beamlets, targeted or directed toward the substrate assembly 108, particularly toward the substrate 118. The assist ion beam 134 controls the net amount of material being deposited on the substrate 118 by the sputter plume 112. In some implementations, the assist ion beam 134 modifies the material that is being deposited by the sputter plume 112.

The assist ion beam system 130 may be, for example, a broad ion beam system, e.g., having a plasma bridge neutralizer (PBN) for generating low energy electrons. The assist ion beam energy ranges in voltage from at least 100V to 2000V, but in some implementations, no more than 1000V. Both the ion beam source 132 and plasma bridge neutralizer (if present) may use the same gases as the IBD ion source 104 of the system 100.

The system 100 typically operates at a process (chamber) pressure of less than $10^{-3}$ torr, e.g., $1 \times 10^{-4}$ to $5 \times 10^{-4}$ torr.

Such a system 100, having an IBD system and an assist ion beam, may be referred to as an ion beam deposition system with assist. System 100, having ion beam deposition with an assist ion beam, can be used to deposit, deposit and modify, and/or deposit and etch either simultaneously or sequentially or interpedently. In one embodiment, the system 100 allows control of the net deposition rate of the target material (e.g., tungsten, ruthenium) on the substrate 118. In another embodiment using the system 100, the microstructure of the target material (e.g., tungsten, ruthenium) deposited on the substrate 118 can be modified as desired, e.g., to obtain the α-phase rather than the β-phase and/or to obtain a desired orientation of the grains by controlling growth habit to form highly oriented textured film with, in some cases, fiber texture along specific planes such as low resistivity (110).

Returning to FIG. 1, the direction 128 is perpendicular to the substrate 118. In the embodiment shown in FIG. 1, this direction 128 is tilted towards the sputter plume 112. In general, the angle the surface of the substrate 118 makes with the sputter plume 112 is called the deposition angle and the angle the surface of the substrate 118 makes with the ion assist beam 134 is called the etch angle. The angles are measured with reference to the direction 128 perpendicular to the surface of the substrate 118. In an embodiment as described in reference to the system 100 shown in FIG. 1, this etch angle is also known as substrate angle. By tilting the substrate assembly 108 retaining the substrate 118 and thereby tilting the direction 128, one can adjust the deposition angle and the etch angle simultaneously. The angles may be adjusted during the operation of the system, periodically, incrementally or continuously.

Either or both the ion beam deposition and the ion beam etch can be at an angle off-normal to the substrate 118. The deposition angle can range from −10 to +70 degrees and the etch angle can range from −10 to +70 degrees. In certain orientations, the deposition angle can range from +10 to −70 degrees and the etch angle can also range from +10 to −70 degrees. In one embodiment of the system 100 shown in FIG. 1, the etch angle is between 0 degrees and −67 degrees and can be varied (adjusted) during the etching process. In one embodiment of the system 100, this etch angle of 0 degrees means a deposition angle of +67 degrees, and an etch angle of −67 degrees is equivalent to a deposition angle of 0 deg. In another embodiment of the system 100, the etch angle is from ±15 to ±50 degrees, or, ±20 to ±25 degrees.

Those skilled in the art will appreciate that the relative positions of the sputter plume 112 and the assist ion beam 134 can be such that the deposition angle and the etch angle can be adjusted over a range of angles depending on the required or desired film property. In another embodiment, the target 106 can have an angle from 20 degrees to 40 degrees relative to the ion beam from the ion beam deposition source 104. Additionally, the skilled artisan will appreciate that in one embodiment of system 100, by tilting the substrate assembly 108 containing the substrate 118 and thereby the direction 128, one can position the substrate 118 in such a manner so that both the sputter plume 112 and assist beam 134 reach the substrate.

By adjusting the net deposition rate of material onto the substrate 118 (e.g., by adjusting the rate of deposition by IBD and the rate of modification by the assist ion beam), not only is the thickness of the deposited material controlled, but the physical properties of the deposited material, including microstructure and grain growth, can be controlled. The net deposition rate is greater than 0.5 angstroms/second, and in some implementations, greater than 1 angstrom/second, or even greater than 5 or 10 angstrom/second. In some implementations, the net deposition rate is no more than 250 angstroms/second, often no more than 200 angstroms/second. An example of a suitable range for the net deposition rate is 50-75 angstroms/second, and another example is 100-150 angstroms/second.

The net deposition rate is affected by the sputter plume 112 and the ion assist beam 134, including the angle of the beams 110, 134. In one example, a deposition angle in a range of +40 to +50 degrees, together with an assist beam or etch angle in a range −20 to −25 degrees, provides a net deposition rate suitable for producing the low resistivity, thin metal films.

Additionally or alternately, the temperature of the system, e.g., the temperature of the surface of the substrate 118, is a factor in obtaining thin, low resistivity metallic films. By having the substrate 118 at a temperature of at least 200° C., in some implementations at least 250° C., and in other implementations at least 300° C., and in other implementations at least 350° C., and in other implementations at least 400° C., low resistivity tungsten films can be obtained; typically, the substrate temperature is no greater than 500°

C. The increased temperature affects the phase and crystal orientation and grain size of the resulting deposited material (e.g., tungsten).

In another embodiment, low resistivity metallic films such as tungsten can be deposited onto the substrate 118 using single or multiple steps having different net deposition rates of material; the net deposition rate can be adjusted by adjusting one or both of the rate of deposition by IBD and the rate of modification by assist ion beam 134, with or without heating of the substrate 118. Different combinations of IBD deposition rates from the deposition ion beam 110 and the assist ion beam 134 modification or etching rates can be selected by adjusting the deposition ion beam energy, e.g., in the range of 500V to 2000V and assist ion beam energy, e.g., in the range of 100V to 2000V. Additionally or alternately, the ion beam flux of the deposition ion beam 110 and the flux of the assist ion beam 134 can be adjusted, e.g., simultaneously, to adjust the energy of the ion beams.

Certain combinations of IBD deposition rates (i.e., ion beam 110) and assist ion beam rates can be chosen to selectively grow metal thin films with desired grain orientations and thin film textures, such as tungsten α-phase with high fraction of α(110) grains. In a similar manner, certain combinations of IBD deposition rates and assist ion beam modification rates can be chosen to selectively grow thin films of low resistivity metals such as but not limited to Mo, Ru, Co, Cu, Rh, and the like in other embodiments, with desired fraction of grains of desired orientations such as but not limited to (110), (100), (111) for cubic systems and (0001) and (1120) for hexagonal systems. In other embodiments, certain combinations of IBD deposition rates and assist ion beam modification rates can be chosen to selectively affect the growth of grains and deposit low resistivity thin films of metals with large grain sizes, e.g., greater than 100 nm average grain size and even greater than 150 nm average grain size, and larger. Thusly, by using different combinations of IBD deposition rates and assist ion beam modification rates, in single or multiple (different) steps, low resistivity metallic thin films can be deposited. By using a certain combination of IBD deposition rate(s) and assist ion beam modification rate(s), a desired texture, such as tungsten α-phase with (110) grains, can be deposited. The growth of the (110) grains can be affected by using same or different combinations of IBD deposition rate(s) and assist ion beam modification rate(s).

Low resistivity metallic films with high smoothness (e.g., as measured by surface roughness of less than 10 Angstroms or less than 5 Angstroms) can also be deposited using the system 100 and the methods described herein. Surface roughness is a measure of the surface irregularity or unevenness of the surface plane of a thin film. For metal thin films, the surface roughness plays a key role in resistivity as rough surfaces can form surface states, traps, and scattering sites for charge carriers, all affecting the resistivity of the film. In addition, rough thin film surfaces can have deleterious impacts on integration and further processing of the metal thin films, Hence there is great interest in depositing smooth thin films or reducing the roughness of thin films.

There are two major methods for measuring roughness of thin films, one is the average roughness and the other is the root mean square deviation (rms) roughness. The average roughness is simply the average deviation of the thin film surface from a reference plane, whereas the rms roughness is the root mean square deviation of the thin film surface from a reference plane. Surface roughness of thin metal films can be measured using transmission electron microscopy (TEM) and atomic force microscopy (AFM). The surface roughness referred to here is the rms roughness of the metal thin films.

A smooth tungsten film can be formed on the substrate 118 using single or multiple steps of different net deposition rate(s) of material by adjusting the combination of rate of deposition by IBD and the rate of modification by assist ion beam, with or without heating of the substrate 118. Certain combinations of IBD deposition rates and assist ion beam modification rates can be chosen to selectively grow metal (e.g., tungsten) thin films with a uniform size distribution such as typified by a low standard deviation of the grain size distribution from the average or alternately measured by a narrow range of grain size distributions around the average. Controlled uniform grain growth and uniform grain size distribution and desired grain size orientation during thin film deposition permits smooth low resistivity of metal thin films when deposited by combining appropriate IBD deposition rate(s) and assist ion beam modification rate(s), with or without heat.

Figure 2:
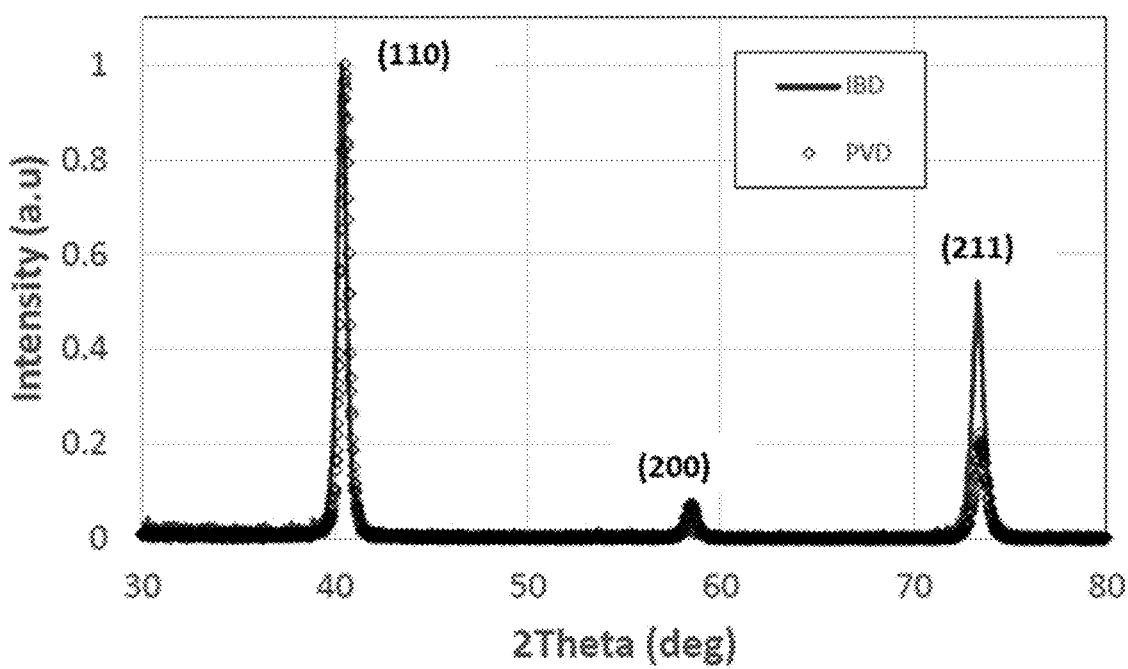
FIG. 2 is a graphical representation of a glancing angle X-ray theta-2theta scan comparing PVD and IBD films.

FIG. 2 is graph 2000 of a glancing angle X-ray theta-2theta scan comparing a tungsten film deposited by PVD to a tungsten film deposited by IBD with an assist ion beam. The graph 200 shows the difference in the microstructure, particularly the amount of α(211) in the films, in the films as formed by the two process methods.

Figure 3:
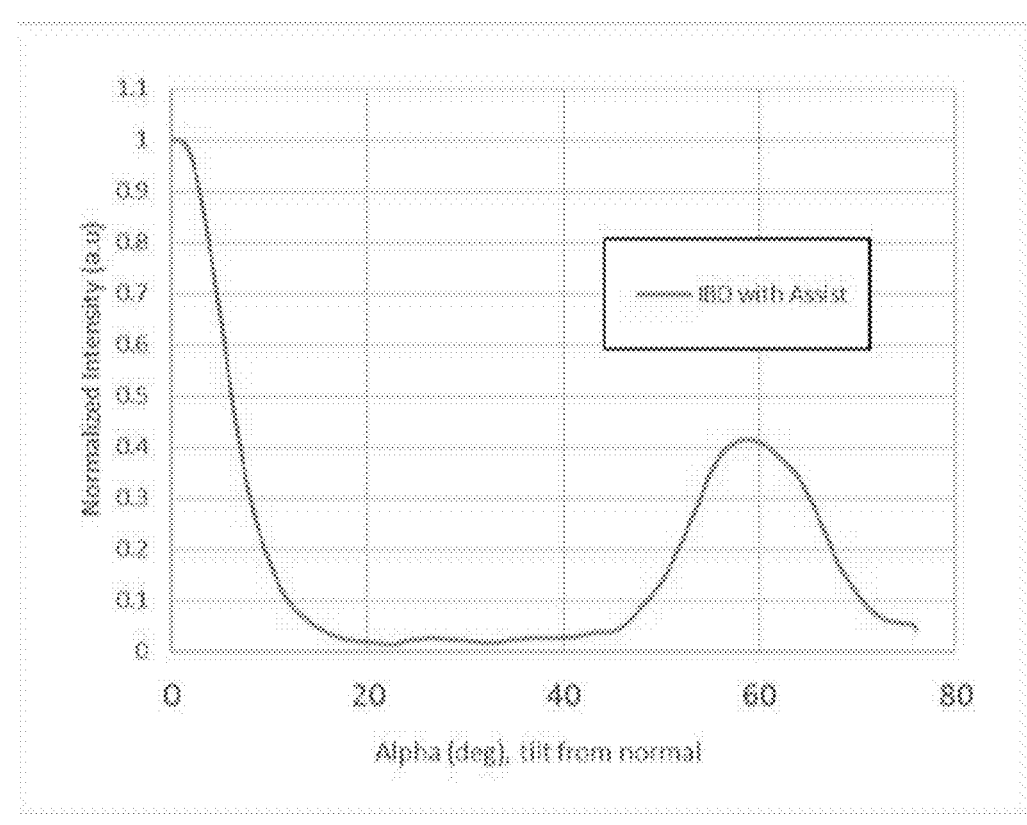
FIG. 3 is a graphical representation of an X-ray chi scan of tungsten film by IBD with assist showing 90% (110) texture.

FIG. 3 is a graph 300 of an X-ray chi scan of the α(110) peak of a low resistivity tungsten film deposited by IBD with an assist ion beam. The graphs shows that >90% of the grains are oriented along the α(110).

FIGS. 4A, 4B, 4C and 4D show Electron Backscattered Diffraction (EBSD) of tungsten films deposited by PVD, IBD, and IBD with an assist ion beam, highlighting the differences in the microstructure, grain size and grain size distribution of tungsten films. For FIG. 4A, the tungsten film was deposited by PVD; for FIG. 4B, the tungsten film was deposited by IBD; for FIG. 4C, the tungsten film was deposited by heated IBD with an assist ion beam; and for FIG. 4D, the tungsten film was deposited by heated IBD with an assist ion beam, using different combinations of IBD deposition rates and assist ion beam modification rates. Each color/shading in these images signifies a crystal direction as determined by inverse pole analysis. The grain orientation key for the crystal direction through use of an inverse pole figure is shown in the figures.

Figures 4A, 4B:
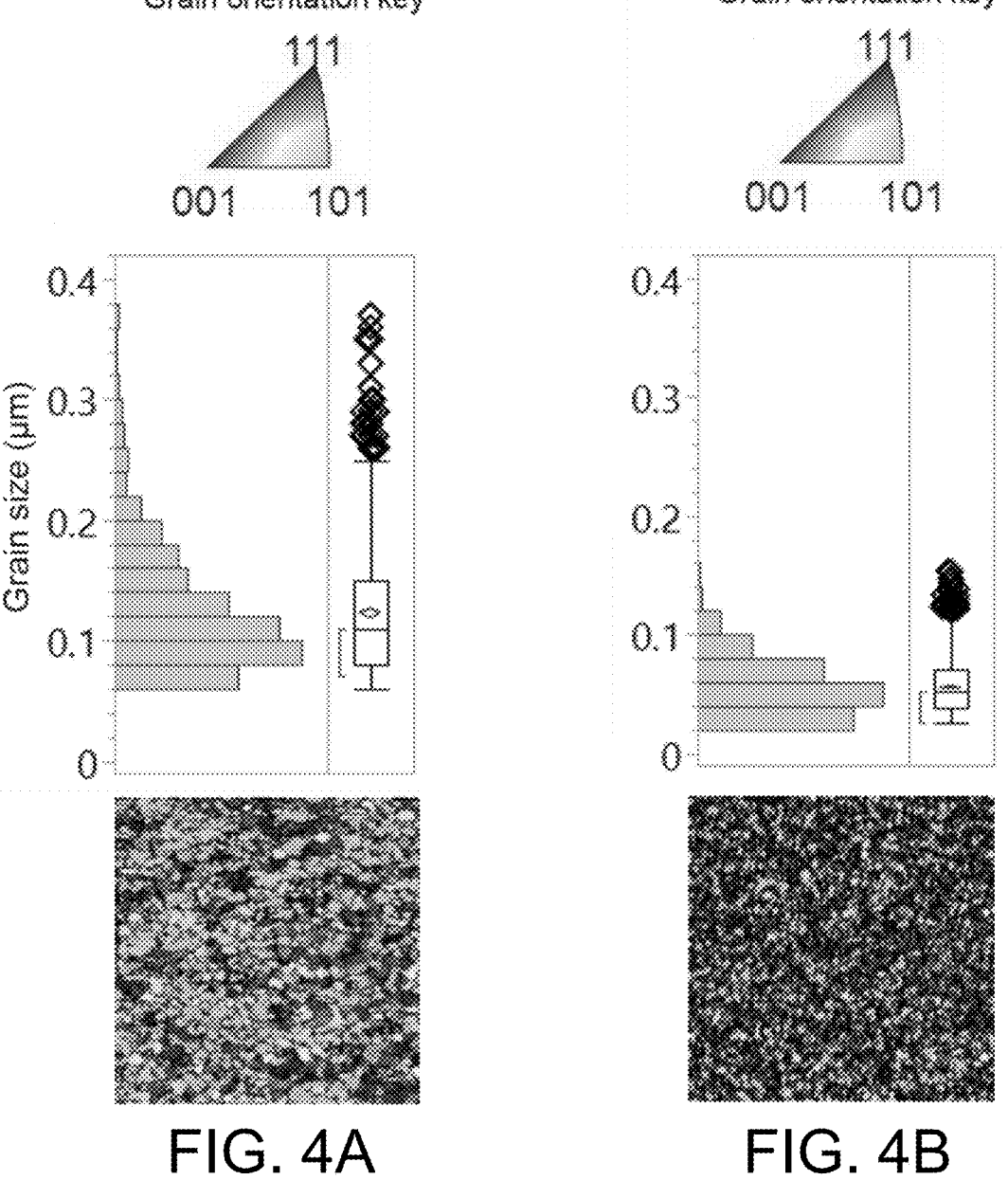
FIG. 4A is an electron photomicrograph (bottom) and a grain size histogram and box plot (center) of a tungsten film made by PVD. The grain orientation key (top) is an inverse pole figure map of the texture.
FIG. 4B is an electron micrograph (bottom) and a grain size histogram and box plot (center) of a tungsten film made by IBD with no assist.

FIGS. 4A and 4B, in the bottom electron micrograph, show the tungsten films deposited by PVD and IBD have grains that are randomly oriented with little or no texture, resulting in higher resistivity. For FIG. 4A, the mean grain size is 120 nm and for FIG. 4B the mean grain size is less, at 56 nm.

Figures 4C, 4D:
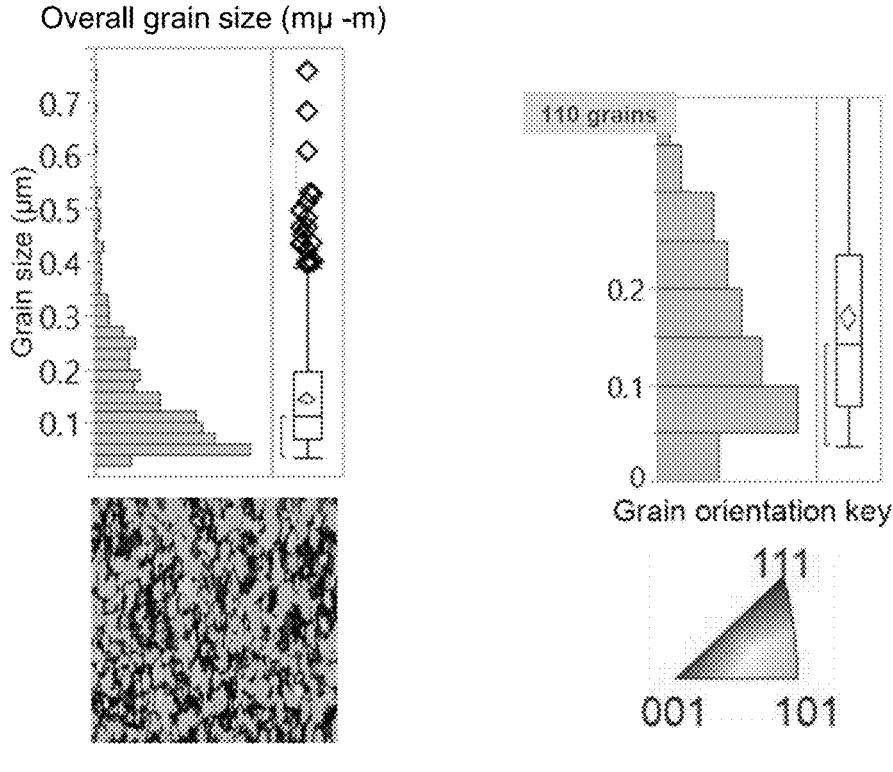
FIG. 4C is an electron micrograph (bottom left), a grain size histogram and box plot (top left) and a grain size histogram and box plot of (110) oriented grains (top right) of a tungsten film made by a heated IBD with an assist ion beam. The grain orientation key is an inverse pole figure map of the texture (bottom right).
FIG. 4D is an electron micrograph (center), grain size histogram and box plot (left) of (110) oriented grains of a tungsten film made by a heated IBD with an assist ion beam. The grain orientation key is an inverse pole figure map of the texture (right).

FIG. 4C, top left graph, shows the tungsten film deposited by heated IBD with an assist ion beam had an average grain size increased by about 20% over PVD (that of FIG. 4A), with a mean grain size of 145 nm, which includes grains of 145-150 nm and even 150 nm and larger. The micrograph in the lower left of FIG. 4C shows the highly oriented and textured nature of the tungsten film produced using heated IBD with ion beam assist. The micrograph shows predominantly grains with α(110) and, in this case, having a fiber texture, with greater than 90% fraction of the grains oriented with α(110) planes. In addition, the α(110) textured grains are preferentially and substantially larger than the grains of non-α(110) and hence larger than the average grain size of the deposited film, having a mean grain size of 170 nm as shown in the top right graph. Thus, the desired textured nature of the tungsten film is significantly increased when prepared using heated IBD with ion beam assist. The resistivity of the film was 8.7 μΩ-cm.

FIG. 4D, center micrograph, shows the tungsten film deposited by heated IBD with an assist ion beam using different combinations of IBD deposition rates and assist ion beam modification rates has large grains of tungsten α-phase with only (110) grains. FIG. 4D also shows the highly oriented and textured nature of the tungsten film. The micrograph shows only grains with α(110) and in this case consisting of a fiber texture with nearly 100% fraction of the grains oriented with α(110) planes. In addition, the α(110) textured grains are preferentially and substantially large, having a mean grain size of 180 nm, as shown in the left graph of FIG. 4D.

From the four figures FIGS. 4A, 4B, 4C and 4D, it is seen that the desired large grain size in the tungsten films is obtained when the film is formed using heated IBD with an assist ion beam using steps with different combinations of IBD deposition rates and assist ion beam modification rates, as shown in FIG. 4D.

Figure 5:
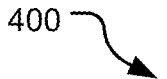
FIG. 5 is a graphical representation of resistivity versus thickness of tungsten films made by IBD with assist.
Figure 5:
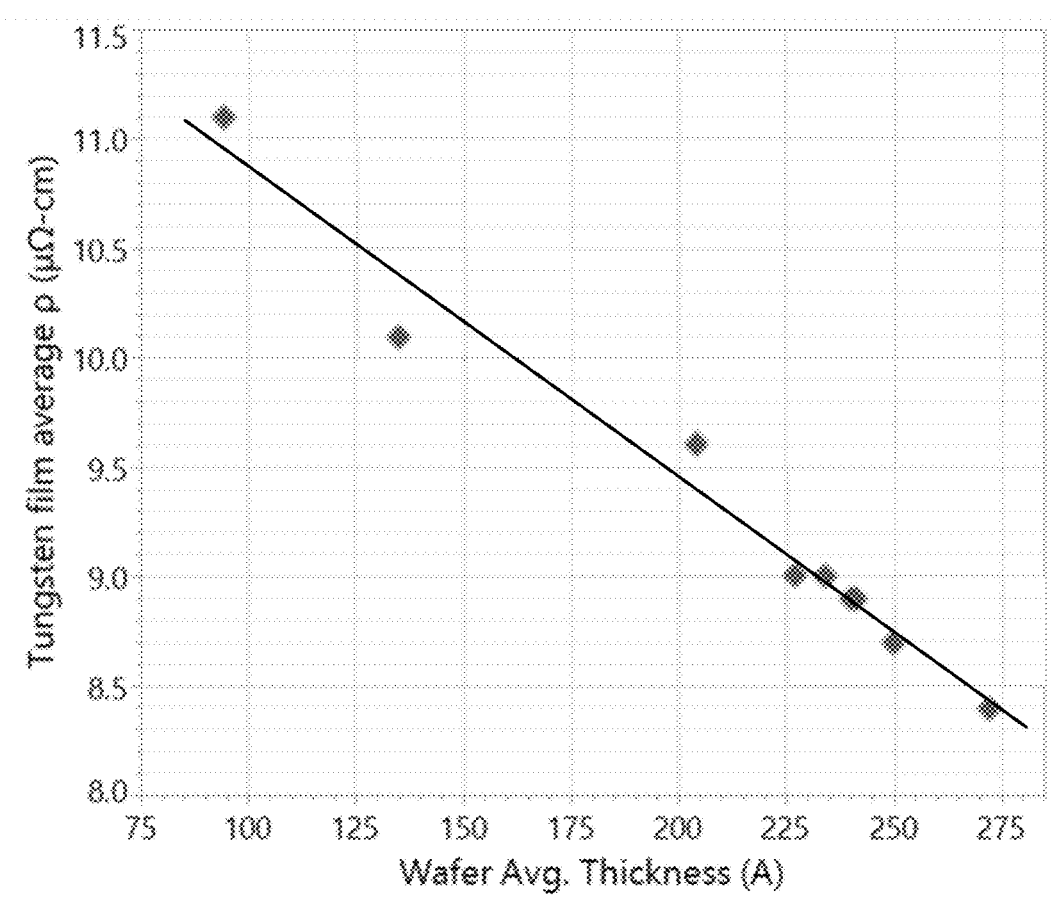
Figure 6:
FIG. 6 is a graphical representation of resistivity versus thickness of ruthenium films made by IBD with assist.
Figure 6:
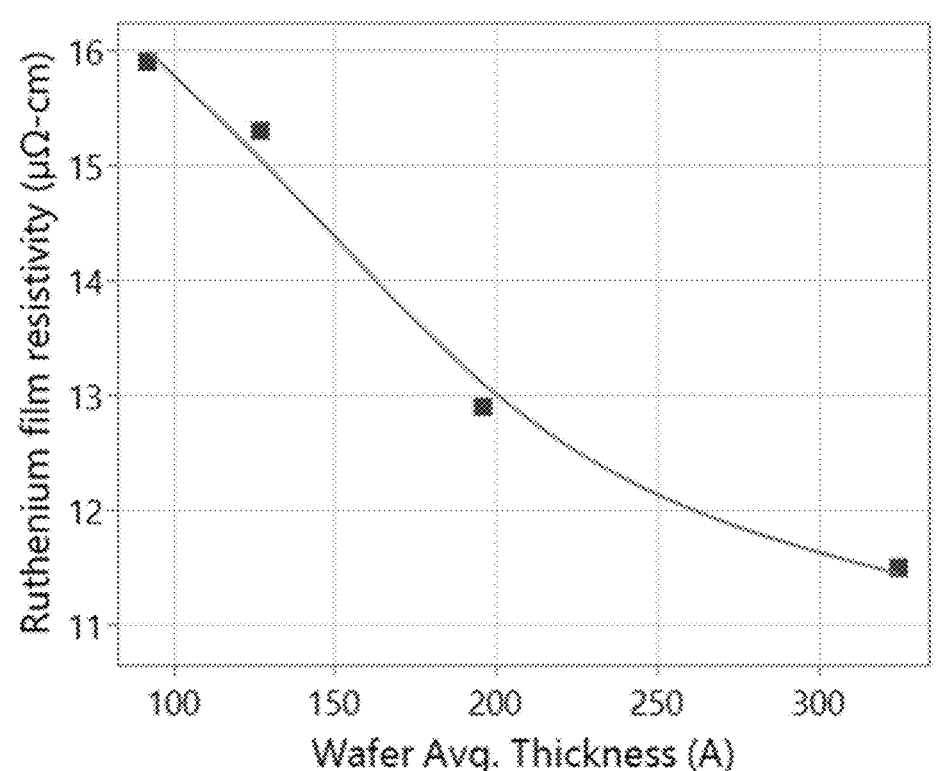

Thus, the microstructure, grain size and grain orientation of metal films can be controlled by using IBD with an assist ion beam. For example, by controlling the microstructure, grain size and grain orientation of a tungsten film by using IBD with an assist ion beam, a low resistivity over a range of thicknesses can be obtained as shown in FIG. 5. FIG. 5 shows a graph 400 illustrating that the resistivity of a tungsten film increases almost linearly as its thickness decreases. Similarly, as a result of controlling the microstructure, grain size and grain orientation of a ruthenium film deposited by IBD with an assist ion beam, low resistivity films over a range of thickness can be obtained. FIG. 6 shows a graph 500 illustrating that the resistivity of a ruthenium film increases as its thickness decreases.

Figure 7A:
FIG. 7A is a TEM micrograph image of a 250 Angstrom thick tungsten film.
Figure 7B:
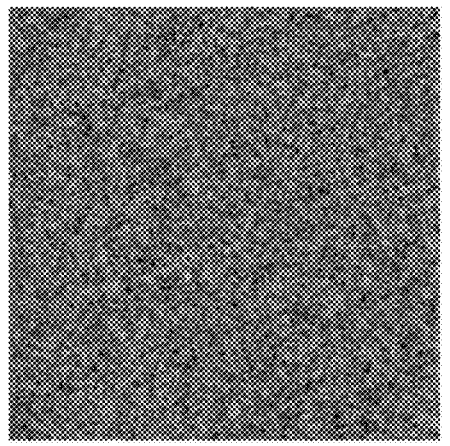
FIG. 7B is an AFM image of a 250 Angstrom thick tungsten film.

As discussed above, there is great interest in depositing smooth thin films or reducing the roughness of thin films, as reduced roughness increases consistency of resistivity. FIG. 7A is a TEM micrograph and FIG. 7B is an AFM image of a 250 Angstrom thick tungsten film formed by IBD using an assist ion beam etching, with heating of the substrate; these figures clearly show the smooth thin film formed.

The above specification and examples provide a complete description of the process and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. Features and elements from one implementation or embodiment may be readily applied to a different implementation or embodiment. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this speci-fication and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed:

1. A metal film comprising:
   a thickness of about 100 to about 300 Angstroms,
   a resistivity of about 8 to 12 μΩ-cm, and
   a highly oriented crystalline structure with greater than 90% of grains in a dominant orientation.

2. The metal film of claim 1, wherein the metal film is tungsten.

3. The metal film of claim 2, having no discernable β-phase.

4. The metal film of claim 1, wherein the crystalline structure has α(110) as the dominant orientation and an average grain size greater than 100 nm.

5. The metal film of claim 1 formed by:
   depositing a metal material from a target onto a substrate via ion beam deposition in a process chamber, the substrate at a temperature of at least 250° C.; and
   simultaneously bombarding at least some of the deposited material from the substrate in the process chamber with an assist ion beam at a net deposition rate of at least 0.5 angstroms/second.

6. The metal film of claim 5, wherein the metal film, the metal material, and the target all comprise tungsten.

7. The metal film of claim 5, further formed by adjusting an ion beam deposition rate and an assist ion beam bombardment rate to control a microstructure, grain size and grain orientation of the metal film.

8. The metal film of claim 5, further formed by adjusting an ion beam deposition rate and an assist ion beam bombardment rate to control a smoothness of the metal film.

9. The metal film of claim 5, wherein the metal film is made using a single step with an ion beam deposition rate and an ion beam bombardment rate.

10. The metal film of claim 5, wherein the metal film is made using multiple steps, including a first step with a first ion beam deposition rate and a first ion beam bombardment rate and a second step with a second ion beam deposition rate and a second ion beam bombardment rate.

11. The metal film of claim 5, wherein the assist ion beam utilizes a voltage of at least 100V and no more than 1000V.

12. The metal film of claim 5, wherein the net deposition rate is between 0.5 angstroms/second and 200 angstroms/second.

* * * * *